(12) United States Patent
Koike et al.

(10) Patent No.: US 6,946,370 B2
(45) Date of Patent: Sep. 20, 2005

(54) SEMICONDUCTOR CRYSTAL PRODUCING METHOD

(75) Inventors: Masayoshi Koike, Aichi-ken (JP); Hiroshi Watanabe, Aichi-ken (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/488,083

(22) PCT Filed: Aug. 5, 2002

(86) PCT No.: PCT/JP02/07990
§ 371 (c)(1),
(2), (4) Date: May 13, 2004

(87) PCT Pub. No.: WO03/021012
PCT Pub. Date: Mar. 13, 2003

(65) Prior Publication Data
US 2004/0241966 A1 Dec. 2, 2004

(30) Foreign Application Priority Data
Sep. 3, 2001 (JP) ........................ 2001-265927

(51) Int. Cl.⁷ ............................................... H01L 21/20
(52) U.S. Cl. ...................... 438/479; 438/478; 438/489; 438/509; 438/492
(58) Field of Search ................................ 438/478–479, 438/489, 509, 492

(56) References Cited

U.S. PATENT DOCUMENTS

| | | | |
|---|---|---|---|
| 5,571,603 A | * | 11/1996 | Utumi et al. ............... 428/212 |
| 5,620,557 A | | 4/1997 | Manabe et al. |
| 6,294,440 B1 | * | 9/2001 | Tsuda et al. ................ 438/479 |
| 6,520,557 B2 | | 2/2003 | Benthaus et al. |
| 6,584,844 B2 | | 7/2003 | Beitia |

FOREIGN PATENT DOCUMENTS

| | | |
|---|---|---|
| JP | 3-183700 | 8/1991 |
| JP | 5-306194 | 11/1993 |
| JP | 7-165498 | 6/1995 |
| JP | 7-202265 | 8/1995 |
| JP | 11-68159 | 3/1999 |
| JP | 2000-12979 | 1/2000 |

OTHER PUBLICATIONS

Translation of International Preliminary Examination Report for PCT/JP2002/07990 dated Jun. 24, 2004.

* cited by examiner

*Primary Examiner*—Luan Thai
(74) *Attorney, Agent, or Firm*—McGinn & Gibb, PLLC

(57) ABSTRACT

In a separation layer removing process α, temperature in a reaction chamber (heat treatment temperature $T_x$) is raised to about 1000° C. and a separation layer A is evaporated through thermal decomposition, to thereby separate about 10 μm in thickness of protection layer B from a base substrate side (a sapphire substrate 101 comprising a buffer layer 102). Because decomposition temperature of the separation layer A is higher than growth temperature of the protection layer B (about 650° C.) and lower than growth temperature of the semiconductor crystal C (about 1000° C.), the separation layer A vanishes (evaporates) by thermal decomposition, which generates this separation process. Accordingly, a semiconductor crystal having a cross sectional structure shown in FIG. 2B is obtained. By employing the protection layer B which is independent from the base substrate side as another crystal growth substrate, dislocations and cracks may not be generated by stress owing to difference of lattice constants or difference of thermal expansion coefficients, and a semiconductor crystal layer C (GaN single crystal) of high quality can be obtained.

17 Claims, 3 Drawing Sheets

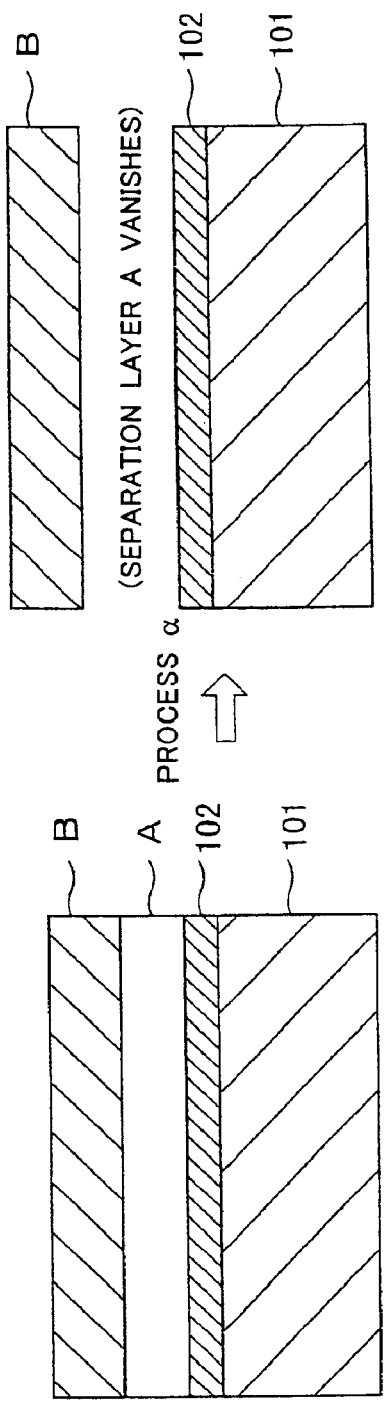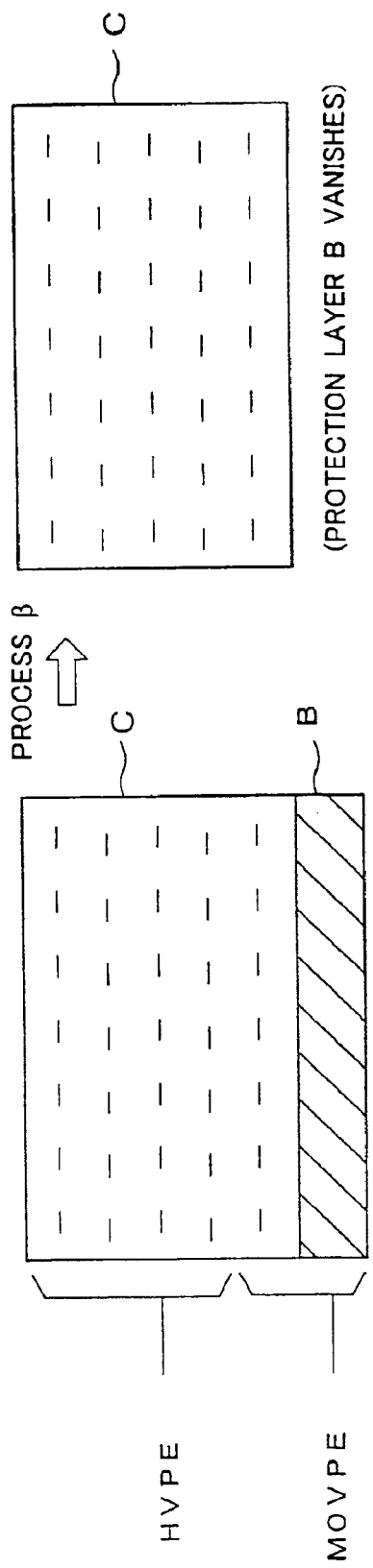

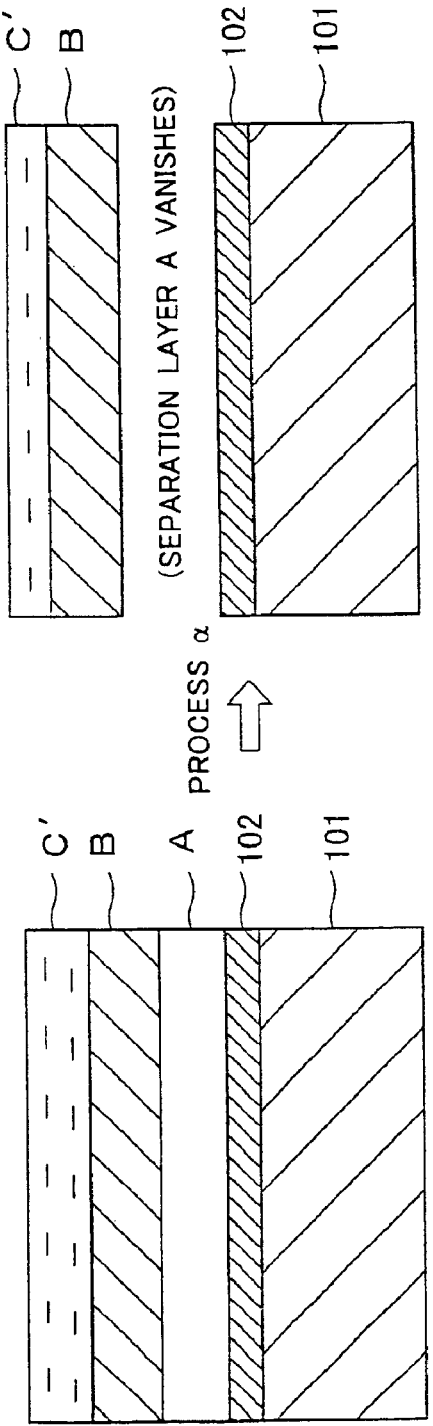
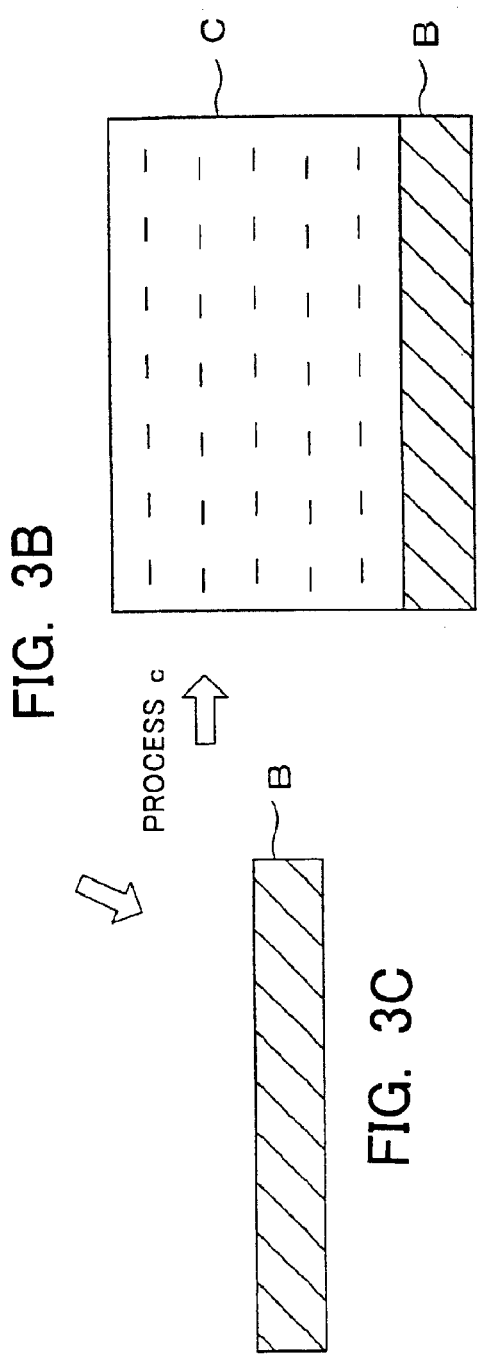
FIG. 3A
FIG. 3B
FIG. 3C
FIG. 3D

SEMICONDUCTOR CRYSTAL PRODUCING METHOD

TECHNICAL FIELD

The present invention relates to a method for growing a semiconductor crystal comprising group III nitride compound semiconductor on a base substrate, to thereby obtain a semiconductor crystal which has excellent quality and is free-standing from the base substrate.

And the present invention can be applied to a production of a crystal growth substrate for various semiconductor devices represented by e.g., LEDs.

BACKGROUND ART

A conventional technique in which a semiconductor crystal consisting of a group III nitride compound semiconductor is grown on a base substrate and a free-standing semiconductor crystal is obtained independently from the base substrate is generally known as, for example, wet etching disclosed in a Japanese Patent Application Laid-Open (kokai) No. 7-202265 entitled "Manufacture of Group III Nitride Semiconductor" and a method comprising steps of growing a thick GaN (semiconductor crystal to be obtained) on a sapphire substrate by using HVPE or other process and removing the sapphire substrate by irradiating laser or polishing.

In a conventional method, difference of thermal expansion coefficients and difference of lattice constants between the base substrate (e.g., sapphire and so on) and a group III nitride compound semiconductor result in applying stress to the objective single crystal (e.g., GaN) when the semiconductor is cooled to ambient temperature after growing process, thereby generating a number of dislocations and cracks in the objective single crystal.

When the objective single crystal is grown to a certain thickness, cracks are generated in the objective single crystal even during the growth process. That easily causes problems such that small pieces are partially peeled off.

DISCLOSURE OF THE INVENTION

The present invention has been accomplished in order to overcome the aforementioned drawbacks. Thus, an object of the present invention is to produce a semiconductor of high quality crystal which is independent from the base substrate.

The following means may be useful to overcome the above-described drawbacks.

That is, the first aspect of the present invention provides a method for producing a semiconductor crystal having excellent quality and independent from a base substrate on which a semiconductor crystal comprising a group III nitride compound semiconductor is grown, comprising: single crystal growth process c in which an objective semiconductor crystal layer C comprising a group III nitride compound semiconductor is deposited; and separation layer removing process α in which a separation layer A which comprises a group III nitride compound semiconductor and is formed between a protection layer B comprising a group III nitride compound semiconductor and having crystal growth front toward the semiconductor crystal layer C and the base substrate is evaporated through thermal decomposition, wherein the separation layer removing process α is carried out before the single crystal growth process c.

That is, for example, the separation layer A comprising materials such as $Ga_{0.5}In_{0.5}N$ and the protection layer B comprising materials such as $Ga_{0.8}In_{0.2}N$ may be formed between the base substrate comprising materials such as sapphire and the objective semiconductor crystal layer C comprising materials such as GaN film.

By applying such structure, the temperature at which the separation layer A evaporates through thermal decomposition can be arranged lower than the temperature at which the protection layer B evaporates through thermal decomposition, and that makes it possible to decompose only the separation layer A through thermal decomposition by raising the temperature.

Because only the separation layer A can be removed through thermal decomposition before forming the semiconductor crystal layer C, the semiconductor crystal layer C may be grown without being influenced by stress generated from the base substrate. That is, the semiconductor crystal layer C which is formed on the free-standing protection layer B may not receive worse affection, i.e., stress owing to difference of lattice constants and difference of thermal expansion coefficients generated from the base substrate.

Accordingly, because the base substrate can be separated from the protection layer B before forming the thick semiconductor crystal layer C (e.g., GaN film), no dislocations or cracks owing to difference of lattice constants and difference of thermal expansion coefficients occur, and a semiconductor crystal layer C of high quality can be obtained. The thus-obtained thick semiconductor crystal layer C (e.g., GaN film) can be employed, for example, as a crystal growth substrate in a semiconductor device. So industrial utility value of the semiconductor crystal layer C is large.

And because the above producing method can be carried out only in a crystal growth process, processes such as laser irradiation and polishing become unnecessary. As a result, the base substrate remains without being polished or cracked, which makes it possible to reuse the base substrate.

The second aspect of the present invention is drawn to the method according to the first aspect, wherein the group III nitride compound semiconductor is made of $Al_{1-x-y}Ga_yIn_xN$ ($0 \leq x \leq 1$, $0 \leq y \leq 1$, $0 \leq 1-x-y \leq 1$).

Here a group III nitride compound semiconductor generally includes a binary, ternary, or quaternary semiconductor represented by a formula $Al_{1-x-y}Ga_yIn_xN$ ($0 \leq x \leq 1$, $0 \leq y \leq 1$, $0 \leq 1-x-y \leq 1$) and having an arbitrary composition ratio. And a group III nitride compound semiconductor in the present specification further includes a semiconductor doped with p-type or n-type impurity.

Alternatively, a semiconductor whose portion of the group III elements (Al, Ga, In) may be replaced with boron (B) or thallium (Tl), and a portion of nitrogen (N) may be replaced with phosphorous (P), arsenic (As), antimony (Sb), or bismuth (Bi) is also included in a group III nitride compound semiconductor of the present specification.

Examples of the p-type dopant which can be added include magnesium (Mg) and calcium (Ca).

Examples of the n-type dopant which can be added include silicon (Si), sulfur (S), selenium (Se), tellurium (Te), and germanium (Ge).

These dopants may be used in combination of two or more species, and a p-type dopant and an n-type dopant may be added simultaneously.

In the present specification, group III nitride compound semiconductor may simply be described as a group III nitride compound.

The third aspect of the present invention is drawn to the method according to the first or second aspect, wherein the base substrate is formed by using sapphire, spinel, manganese oxide, lithium gallium oxide ($LiGaO_2$), molybdenum sulfide (MoS), silicon (Si), carbon silicide (SiC), AlN, GaAs, InP, GaP, MgO, ZnO, or $MgAl_2O_4$.

Any material which can endure at a temperature in the heat treatment while carrying out the separation layer removing process α may be employed to form the base substrate. In short, a well-known or arbitrary crystal growth substrate which is useful for crystal growth of a group III nitride compound semiconductor may be used as materials to form the base substrate.

The fourth aspect of the present invention is drawn to the method according to any one of the first to third aspects, wherein the relationship among the heat treatment temperature $T_X$ in the separation layer removing process α, the crystal growth temperature $T_C$ of the semiconductor crystal layer C, and the crystal growth temperature $T_B$ of the protection layer B is $T_B < T_X \leq T_C$.

The decomposition temperature ($T_X$) of the separation layer A can be arranged between the growth temperature ($T_B$) of the protection layer B and the growth temperature ($T_C$) of the semiconductor crystal layer C by controlling compositions of the separation layer A and the protection layer B. And, by arranging the decomposition temperature $T_X$ between $T_B$ and $T_C$, the separation layer A can be vanished through thermal decomposition occurred in a heating process by the time the semiconductor crystal layer C is formed. As a result, undesirable affection such as stress from the base substrate can be spontaneously prevented and the semiconductor crystal layer C can be grown.

The fifth aspect of the present invention is drawn to the method according to any one of the first to fourth aspects, wherein the protection layer B is formed to have indium (In) composition ratio smaller than the indium (In) composition ratio of the separation layer A. That is, in the semiconductor crystal having compositions of $In_xGa_{1-x}N$, indium (In) composition ratio x1 of the protection layer B may preferably be about 0.2 and indium (In) composition ratio x2 of the separation layer A may preferably be about 0.5 (>x1). By applying such indium (In) composition ratios x1 and x2, for example, only the separation layer A can be sufficiently removed while the protection layer B with excellent quality can stably remain in the separation removing process α.

The sixth aspect of the present invention is drawn to the method according to any one of the first to fifth aspects, wherein the semiconductor crystal layer C is made of gallium nitride (GaN) at a temperature of 900° C. to 1100° C. through crystal growth.

As a composition of the semiconductor crystal layer C, gallium nitride (GaN) is the most optimum and very useful to form a crystal growth substrate of a semiconductor and is considered to have the highest industrial utility. And by forming the gallium nitride (GaN) around 1000° C. through crystal growth, a single crystal having the highest quality can be obtained.

AlGaN and AlGaInN also have high industrial utility. SO they may be alternatively used as compositions of the semiconductor crystal layer C.

The seventh aspect of the present invention is drawn to the method according to any one of the first to sixth aspects, wherein the protection layer B is made of $Ga_{1-x}In_xN$ ($0.0 \leq x \leq 0.8$) through crystal growth. More preferably, indium (In) composition ratio x of the protection layer B may be in a range of 0.05 to 0.5.

Further preferably, although it depends on indium (In) composition ratio of the separation layer A and the temperature of heat treatment in the separation layer removing process α, indium (In) composition ratio x of the protection layer B may be in a range of 0.1 to 0.3. By arranging the indium (In) composition ratio x in such a range, for example, the protection layer B having excellent quality can remain stably in the separation layer removing process α.

Alternatively, it is also possible to form the protection layer B by using GaN.

Thickness of the protection layer B may preferably be in a range from 0.1 μm to 100 μm, and more preferably in a range from 5 μm to 20 μm. When thickness of the protection layer B is too large, it takes unnecessarily longer time for crystal growth, which is not desirable. When thickness of the protection layer B is too small, the protection layer B tends to be ruptured or damaged while handling the protection layer B in the substrate taking out process, which is not desirable.

The eighth aspect of the present invention is drawn to the method according to any one of the first to seventh aspects, wherein the separation layer A is formed through crystal growth by using $Ga_{1-x}In_xN$ ($0.05 \leq x \leq 1.0$). More preferably, indium (In) composition ratio x of the separation layer A is in a range from 0.3 to 0.7.

Further preferably, although it depends on indium (In) composition ratio of the protection layer B and the temperature of heat treatment in the separation layer removing process α, indium (In) composition ratio x of the separation layer A may be in a range of 0.4 to 0.6. By arranging the indium (In) composition ratio x in such range, for example, the separation layer A can be sufficiently removed in the separation layer removing process α.

Thickness of the separation layer A may preferably be in a range from 0.1 μm to 100 μm, and more preferably in a range from 5 μm to 20 μm. When thickness of the separation layer A is too large, it takes unnecessarily longer time for crystal growth, which is not desirable. When thickness of the separation layer A is too small, it tends to happen that the base substrate (e.g.: sapphire) and the protection layer B cannot be separated securely, which is not desirable.

The ninth aspect of the present invention is drawn to the method according to any one of the first to eighth aspects, wherein the temperature $T_X$ of heat treatment carried out in the separation layer removing process α is in a range from 700° C. to 1100° C.

Although it depends on composition of each semiconductor layers A, B and C, the optimum value of the temperature $T_X$ may most preferably be the same or around 1000° C. in order to reduce the time for heat treatment and to maintain crystallinity of the protection layer B.

The tenth aspect of the present invention is drawn to the method according to any one of the first to ninth aspects, further comprising a protection layer removing process β in which the protection layer B is evaporated by heat treatment is carried out after the single crystal growth process c.

For example, by raising the temperature in a reaction chamber to the decomposition temperature of the protection layer B (e.g.: around 1100° C. to 1200° C.) after forming the semiconductor crystal layer C comprising such as GaN by crystal growth, the protection layer B can also be vanished and only the semiconductor crystal layer C remains. As a result, a free-standing semiconductor single crystal having single layer structure can be obtained.

Here, the protection layer B may not be necessarily removed after carrying out the single crystal growth process c. Whether the protection film removing process β is carried out in the present invention or not may be determined comprehensively by fully considering each condition of the semiconductor device such as structure, function, performance, use, unit price, and so on.

The eleventh aspect of the present invention is drawn to the method according to the tenth aspect, wherein the heat treatment temperature in the protection layer removing process β is in a range from 900° C. to 1200° C. Although it depends on compositions of the protection layer B and the semiconductor crystal layer C, the optimum value of the heat treatment temperature enables to suppress damages to the semiconductor crystal layer C and effectively vanish the protection layer B.

When the heat treatment temperature is too high, damages toward the semiconductor crystal layer C become larger and a semiconductor crystal having excellent crystallinity cannot be obtained. When heat treatment temperature is too low, it becomes difficult to remove the protection layer B securely or it takes much longer time to remove the protection layer B, which is not desirable.

For example, when the semiconductor crystal layer C is made of GaN and indium (In) composition ratio x of the protection layer B is around 0.2, the heat treatment temperature in the protection layer removing process β may preferably around 1150° C. Accordingly, the protection layer B can be sufficiently removed while crystallinity of the semiconductor crystal layer C is maintained sufficiently excellent.

The twelfth aspect of the present invention is drawn to the method according to any one of the first to eleventh aspects, further comprising a cap layer depositing process in which a cap layer, which protects the protection layer B from thermal decomposition in the separation layer removing process α, is deposited on the protection layer B before the separation layer removing process α.

The compositions, the growth temperature and the thickness of the cap layer may preferably be determined so that the cap layer vanishes suitably by thermal decomposition by the time when the semiconductor crystal layer C starts to grow.

Accordingly, by depositing and vanishing the cap layer, crystallinity of the surface of the protection film B (crystal growth front of the semiconductor crystal layer C) can be maintained sufficiently excellent at a high temperature during heat treatment and so on. As a result, the semiconductor crystal layer C can become a single crystal having excellent crystallinity more securely.

Also, it is effective to form the cap layer to have approximately the same composition as that of the semiconductor crystal layer C. That enables to start and carry on crystal growth of the semiconductor crystal layer C having excellent quality even when all of the cap layer cannot be removed but a portion of the cap layer remains on the protection layer B.

The conventional arts relating to such a cap layer are disclosed in, for example, a Japanese patent application Laid-open No. H11-68159: Group III Nitride Compound Semiconductor Device. In that prior art document, basic principle with respect to the cap layer of the present invention is explained more generally.

The thirteenth aspect of the present invention is drawn to the method according to the twelfth aspect, wherein the cap layer comprises a group III nitride compound semiconductor having approximately the same composition as that of the semiconductor crystal layer C is grown through crystal growth at a growth temperature lower than the crystal growth temperature $T_C$ of the semiconductor crystal layer C.

The fourteenth aspect of the present invention is drawn to the method according to the twelfth or thirteenth aspect, wherein a gallium nitride (GaN) is grown through crystal growth as the cap layer at a growth temperature from 800° C. to 1000° C.

By applying those conditions, for example, the cap layer depositing process as described in the twelfth aspect can be smoothly carried out.

The fifteenth aspect of the present invention is drawn to the method according to any one of the first to fourteenth aspects, wherein the crystal growth of all or at least the latter part of the single crystal growth process c is carried out by a second crystal growth (e.g.: HVPE) having a growth rate faster than that of the crystal growth (e.g.: MOVPE) which had been carried out by that time.

For example, by the time when the semiconductor crystal layer C is formed to have a certain thickness (e.g.: about 10 µm to 50 µm), a crystal growth method which can grow a single crystal of excellent quality (e.g.: MOVPE) is employed and then a crystal growth method which can effectively grow thick semiconductor crystal layer (e.g.: HVPE) is employed. That enables to supply a semiconductor crystal having excellent quality and optimum thickness (e.g.: about 100 µm to 200 µm) in a shorter time.

The sixteenth aspect of the present invention is drawn to the method according to any one of the first to fifteenth aspects, wherein the crystal growth temperature $T_A$ of the separation layer A and the crystal growth temperature $T_B$ of the protection layer B are arranged from 400° C. to 900° C.

By applying that range of crystal growth temperature, the protection layer B which provides a growth front to the objective semiconductor crystal layer C can have excellent crystallinity. Each crystal growth temperature of the semiconductor layers A and B may preferably be about 450° C. to 700° C.

More preferably, the growth temperature of the separation layer A may be about 500° C. to 700° C. when the indium composition ratio x of the separation layer A is about 0.4 to 0.6. And the growth temperature of the separation layer B may preferably be about 600° C. to 800° C. when the indium composition ratio x of the separation layer B is about 0.1 to 0.3. By applying such ranges of growth temperature, a single crystal film having an objective indium composition ratio can be formed to have high quality and at the same time the protection layer having excellent quality can be remained stably in the separation layer removing process α.

The seventeenth aspect of the present invention is drawn to the method according to any one of the first to sixteenth aspects, wherein the relationship between the crystal growth temperature $T_A$ of the separation layer A and the crystal growth temperature $T_B$ of the separation layer B is $T_A \leq T_B$.

That is, when the crystal growth temperature $T_A$ of the separation layer A is about 500° C. and the crystal growth temperature $T_B$ of the separation layer B is about 650° C., for example, a single crystal (semiconductor crystal layer C) having excellent crystallinity can often be obtained. Moreover, the crystal growth temperatures $T_A$ and $T_B$ can be arranged closer with each other.

Accordingly, the protection layer B can be stable more than the separation layer A during carrying out heat treatment in the separation layer removing process.

Through employment of the aforementioned aspects of the present invention, the aforementioned drawbacks can be overcome effectively and rationally.

BRIEF DESCRIPTION OF THE DRAWINGS

FIGS. 2A–2D are sectional views of a group III nitride compound semiconductor according to the first embodiment of the present invention.

FIGS. 3A–3D are schematic views of a group III nitride compound semiconductor according to the second embodiment of the present invention.

BEST MODE FOR CARRYING OUT THE INVENTION

Figure 1:
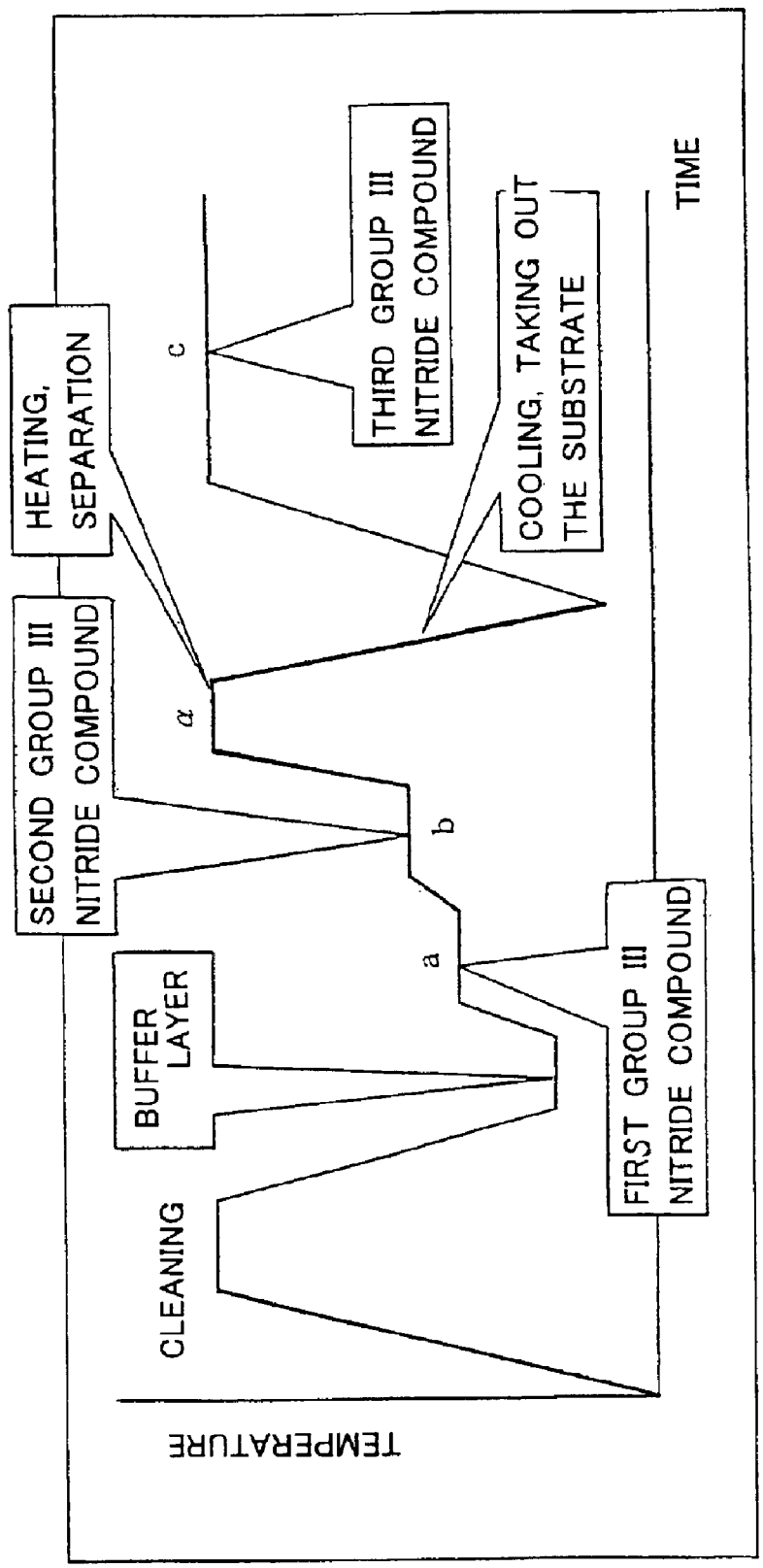
FIG. 1 is a graph showing a temperature in a reaction chamber before carrying out a single-crystal growth process c according to the first embodiment of the present invention.

Embodiments of the present invention will next be described based on concrete examples. The scope of the present invention, however, is not limited to the embodiment described below.

(First Embodiment)

In the first embodiment of the present invention, MOVPE is carried out as the former part of a process for growing a single crystal in which an objective semiconductor crystal layer C made of group III nitride compound semiconductor (GaN) is deposited (a former process in which the semiconductor crystal layer C grows to have thickness of about 30 $\mu$m), and HVPE is carried out as the latter part of the process (the latter part of the process in which the semiconductor crystal layer C grows to have thickness of about 150 $\mu$m).

FIG. 1 is a graph showing variation of temperature in a reaction chamber before carrying out a single crystal growth process c (the former part of the process described above) in the first embodiment of the present invention. In FIG. 1, "a" represents a separation layer deposition process in which a separation layer A made of a first group III nitride compound semiconductor ($Ga_{0.50}In_{0.50}N$) through crystal growth (MOVPE), "b" represents a protection layer deposition process in which a protection layer B made of a second group III nitride compound semiconductor ($Ga_{0.80}In_{0.20}N$) through crystal growth (MOVPE), and "c" represents a single-crystal growth process in which a third group III nitride compound semiconductor, or an objective semiconductor crystal layer C is deposited through crystal growth (MOVPE).

And "α" in the graph represents a separation layer removing process in which the separation layer A is evaporated to vanish in a heat treatment (increasing temperature).

FIGS. 2A–2D are sectional views showing the structure of a group III nitride compound semiconductor before and after each process carried out in the first embodiment.

In the following Example, a method for producing a GaN single crystal (semiconductor crystal layer C) according to a first embodiment of the present invention and FIGS. 1 and 2A–2D will be described.

1. Cleaning Process

First, a reaction chamber is exhausted, and a susceptor on which a sapphire substrate 101 is placed is heated to be about 1000° C., to thereby clean the crystal growth front of the sapphire substrate 101.

2. MOVPE Method (Before Separation)

(1) Buffer Layer Forming Process

Next, a buffer layer 102 made of AlN and having a thickness of about 500 Å is formed on the crystal growth front of a sapphire substrate 101. Crystal growth temperature at this time is about 420° C.

(2) Separation Layer Depositing Process a

Next, a separation layer A made of a first group III nitride compound semiconductor ($Ga_{0.50}In_{0.50}N$) and having a thickness of about 10 $\mu$m is formed. Crystal growth temperature $T_A$ at this time is about 500° C.

(3) Protection Layer Depositing Process b

Next, a protection layer B made of a second group III nitride compound semiconductor ($Ga_{0.80}In_{0.20}N$) and having a thickness of about 10 $\mu$m is formed. Crystal growth temperature $T_A$ at this time is about 650° C.

Accordingly, a semiconductor crystal having a structure shown in FIG. 2A was obtained through the method described above.

3. Separation Layer Removing Process α

Next, a reaction chamber is exhausted and heated until the temperature of the chamber (heat treatment temperature $T_X$) becomes about 1000° C., and the separation layer A described above is evaporated, to thereby separate about 10 $\mu$m in thickness of the protection layer B from the sapphire substrate 101 on which the buffer layer 102 is formed.

Because decomposition temperature of the separation layer A is smaller than temperature for forming the protection layer B (about 650° C.) and temperature for forming the semiconductor crystal layer C (about 1000° C.), the separation layer A is vanished (evaporated) and the protection layer B is separated from the base substrate (sapphire substrate 101).

Accordingly, a semiconductor crystal having a structure shown in FIG. 2B was obtained through the method described above.

4. Base Substrate Taking Out Process

Next, by cooling the reaction chamber to the ambient temperature, the sapphire substrate 101 (base substrate) on which the buffer layer 102 is formed and about 10 $\mu$m in thickness of protection layer B are cooled, to thereafter take out the sapphire substrate 101 from the reaction chamber.

5. Single Crystal Growth Process (1) Evacuating and Heating Process

Next, the reaction chamber is evacuated and heated until its temperature (crystal growth temperature $T_C$ of the semiconductor crystal layer C) becomes about 1000° C.

(2) Single Crystalline Growth Process c (Former Part)

Next, through MOVPE, a part of an objective semiconductor crystal layer C made of GaN (about 30 $\mu$m in thickness) is deposited.

(3) Single Crystalline Growth Process c (Latter Part)

Then, through HVPE (the second crystal growth process), crystal growth is carried out until the above-described semiconductor crystal layer C grows to have a thickness about 150 $\mu$m on about 30 $\mu$m in thickness of GaN single crystal (a part of the semiconductor crystal layer C) which functions as a substrate. At this time, crystal growth temperature may be around 1000° C.

Accordingly, a semiconductor crystal having a structure shown in FIG. 2C was obtained through the method described above.

6. Protection Layer Removing Process β

Then, the protection layer B is heated to its decomposition temperature (about 1150° C.), and it is vanished through thermal decomposition (vaporization). As a result, only the semiconductor crystal layer C (GaN layer) remains, resulting in obtaining a free-standing GaN substrate.

Accordingly, a semiconductor crystal having a structure shown in FIG. 2D was obtained through the method described above.

In the present invention, the present process β may be abbreviated.

Accordingly, the base substrate can be separated from the protection layer B before forming a thick semiconductor crystal layer C (GaN film), and a semiconductor crystal layer C having a sufficient thickness and excellent quality, in which no dislocations nor cracks owing to difference of lattice constants or thermal expansion coefficients with the base substrate (sapphire substrate 101) are generated, is obtained through the method described above.

(Second Embodiment)

FIGS. 3A–3D are sectional views showing the structure of a group III nitride compound semiconductor before and after each process carried out in the second embodiment of the present invention.

This second embodiment is basically carried out according to the method of the first embodiment. Further, in this embodiment, after the protection layer depositing process b, the following step is carried out: a GaN layer C' (cap layer C') is grown to be a thickness of about 20 μm in a temperature of about 900° C. on the Ga$_{0.80}$In$_{0.20}$N protection layer B having thickness of about 10 μm; and the temperature is then raised to be about 1000° C. to evaporate the separation layer A arranged in a middle layer, to thereby separate the base substrate side which comprises the sapphire substrate 101 and the AlN buffer layer 102 and the new crystal growth substrate side which comprises the GaN layer C' and the protection layer B.

By applying the above-described method, for example, the cap layer C' (GaN layer C') which functions as a protection film enables to maintain crystallinity of the protection layer B, which tends to be damaged by thermal decomposition and so on, comparatively stable around a temperature of 900° C. to 1000° C. As a result it is possible or easy to favorably start the single crystalline growth process c in which a semiconductor crystal layer C is formed through crystal.

The compositions, the growth temperature and the thickness of the cap layer C' may preferably be determined so that the cap layer vanishes suitably by the time when the semiconductor crystal layer C starts to grow.

Accordingly, by depositing and vanishing the cap layer C', crystallinity of the surface of the protection film B (crystal growth front of the semiconductor crystal layer C) can be maintained sufficiently excellent at a high temperature during heat treatment and so on. As a result, the semiconductor crystal layer C can become a single crystal with high quality more securely.

For example, as explained above, generally it is effective to form the cap layer C' to have approximately the same composition as that of the semiconductor crystal layer C. That enables to start and carry on crystal growth of the semiconductor crystal layer C having an excellent quality in case that all the cap layer C' cannot be removed but a portion of the cap layer C' remains on the protection layer B.

Alternatively, a group III nitride compound semiconductor having approximately the same composition as that of the semiconductor crystal layer C and functions as the cap layer C' may be grown through crystal growth at a growth temperature lower than the crystal growth temperature $T_C$ of the semiconductor crystal layer C. By applying that process, the cap layer C' can be rather easily vanished around the crystal growth temperature $T_C$ of the semiconductor crystal layer C. That makes it comparatively easier to design the cap layer C' to be vanished by thermal decomposition with no excess or deficiency. Further, even when the cap layer C' cannot be removed and a portion of it remains on the protection layer B, because the cap layer C' has the same composition as that of the semiconductor crystal layer C, it is possible or easier to start (or carry on) growing the semiconductor crystal layer C having excellent quality through crystal growth.

In the above embodiments, alternatively other crystal growth method such as MOVPE can be employed in place of halide vapor phase growth (HVPE). That is, only one crystal growth process may be carried out without employing the second crystal growth process.

While the present invention has been described with reference to the above embodiments as the most practical and optimum ones, the present invention is not limited thereto, but may be modified as appropriate without departing from the spirit of the invention.

What is claimed is:

1. A method for producing a semiconductor crystal having excellent quality and independent from a base substrate on which a semiconductor crystal comprising a group III nitride compound semiconductor is grown, comprising:

single crystal growth process c in which an objective semiconductor crystal layer C comprising a group III nitride compound semiconductor is deposited; and separation layer removing process α in which a separation layer A which comprises a group III nitride compound semiconductor and is formed between a protection layer B comprising a group III nitride compound semiconductor and having crystal growth front toward said semiconductor crystal layer C and said base substrate is evaporated through thermal decomposition, wherein said separation layer removing process α is carried out before the single crystal growth process c.

2. A method for producing a semiconductor crystal according to claim 1, wherein said group III nitride compound semiconductor is made of Al$_{1-x-y}$Ga$_y$In$_x$N (0≦x≦1, 0≦y≦1, 0≦1-x-y≦1).

3. A method for producing a semiconductor crystal according to claim 1, wherein said base substrate comprises at least one selected from the group consisting of sapphire, spinel, manganese oxide, lithium gallium oxide (LiGaO$_2$), molybdenum sulfide (MoS), silicon (Si), carbon silicide (SiC), AlN, GaAs, InP, GaP, MgO, ZnO, and MgAl$_2$O$_4$.

4. A method for producing a semiconductor crystal according to claim 1, wherein relationship among said heat treatment temperature $T_X$ in said separation layer removing process α, said crystal growth temperature $T_C$ of said semiconductor crystal layer C, and said crystal growth temperature $T_B$ of said protection layer B is $T_B < T_X \leq T_C$.

5. A method for producing a semiconductor crystal according to claim 1, wherein said protection layer B is formed to have indium (In) composition ratio smaller than indium (In) composition ratio of said separation layer A.

6. A method for producing a semiconductor crystal according to claim 1, wherein said semiconductor crystal layer C is made of gallium nitride (GaN) at a temperature of 900° C. to 1100° C. through crystal growth.

7. A method for producing semiconductor crystal according to claim 1, wherein said protection layer B is made of Ga$_{1-x}$In$_x$N (0.0≦x≦0.8) through crystal growth.

8. A method for producing semiconductor crystal according to claim 1, wherein said separation layer A is formed through crystal growth by using Ga$_{1-x}$In$_x$N (0.05≦x≦1.0).

9. A method for producing semiconductor crystal according to claim 1, wherein said temperature $T_X$ of heat treatment carried out in said separation layer removing process α is in a range from 700° C. to 1100° C.

10. A method for producing semiconductor crystal according to claim 1, further comprising: a protection layer removing process β in which said protection layer B is evaporated by heat treatment is carried out after said single crystal growth process c.

11. A method for producing semiconductor crystal according to claim 10, wherein heat treatment temperature in the protection layer removing process β is in a range from 900° C. to 1200° C.

12. A method for producing semiconductor crystal according to claim 1, further comprising: a cap layer depositing process in which a cap layer, which protects the protection layer B from thermal decomposition in the separation layer removing process α, is deposited on the protection layer B before the separation layer removing process α.

13. A method for producing semiconductor crystal according to claim 12, wherein said cap layer comprises a group III nitride compound semiconductor having approximately the same composition as that of said semiconductor crystal layer C and is grown through crystal growth at a growth temperature lower than said crystal growth temperature $T_C$ of said semiconductor crystal layer C.

14. A method for producing semiconductor crystal according to claim 12, wherein a gallium nitride (GaN) is grown through crystal growth as said cap layer at a growth temperature from 800° C. to 1000° C.

15. A method for producing semiconductor crystal according to claim 1, wherein said crystal growth of all or at least the latter part of said single crystal growth process c is carried out by a second crystal growth having a growth rate faster than a growth rate of said crystal growth which had been carried out by that time.

16. A method for producing semiconductor crystal according to claim 1, wherein said crystal growth temperature $T_A$ of said separation layer A and said crystal growth temperature $T_B$ of said protection layer B are arranged from 400° C. to 900° C.

17. A method for producing semiconductor crystal according to claim 1, wherein relationship between crystal growth temperature $T_A$ of the separation layer A and crystal growth temperature $T_B$ of the separation layer B is $T_A \leq T_B$.

* * * * *